US008415626B1

(12) United States Patent
Wong

(10) Patent No.: US 8,415,626 B1
(45) Date of Patent: *Apr. 9, 2013

(54) INTRINSICALLY SAFE NDIR GAS SENSOR IN A CAN

(75) Inventor: Jacob Y Wong, Goleta, CA (US)

(73) Assignee: Airware, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/218,984

(22) Filed: Aug. 26, 2011

Related U.S. Application Data

(63) Continuation-in-part of application No. 13/210,255, filed on Aug. 15, 2011, now Pat. No. 8,158,946, which is a continuation-in-part of application No. 12/868,628, filed on Aug. 25, 2010, now Pat. No. 8,003,945.

(51) Int. Cl.
*G01N 21/61* (2006.01)
*G01J 5/02* (2006.01)

(52) U.S. Cl.
USPC .......................... 250/343; 250/340; 250/345

(58) Field of Classification Search ............ 250/343
See application file for complete search history.

(56) References Cited

U.S. PATENT DOCUMENTS

| | | | |
|---|---|---|---|
| 6,991,987 B1 * | 1/2006 | Guo et al. | 438/264 |
| 7,063,667 B1 * | 6/2006 | Ben-Oren et al. | 600/532 |
| 8,003,945 B1 * | 8/2011 | Wong | 250/343 |
| 8,158,946 B2 * | 4/2012 | Wong | 250/343 |
| 2008/0185524 A1 * | 8/2008 | Kanstad | 250/338.5 |

* cited by examiner

*Primary Examiner* — David Porta
*Assistant Examiner* — Marcus Taningco
(74) *Attorney, Agent, or Firm* — Roy L. Anderson; Wagner, Anderson & Bright P.C.

(57) ABSTRACT

An NDIR gas sensor is housed within a mechanical housing made up of a header housing, a can mounted to the header housing, and a sample chamber mounted above the can. The can has a top surface with a pair of windows formed in it to allow radiation to enter and return from the sample chamber. An electronics module is mounted on a printed circuit board hermetically sealed within the can. A signal channel path length detected by the signal detector is greater than a reference channel path length detected by the reference detector and an absorption bias between the signal and reference outputs can be used to determine a gas concentration in the sample chamber. Both the signal detector and the reference detector have an identical narrow band pass filter with the same Center Wavelength ("CWL"), Full Width Half Maximum (FWHM) and transmittance efficiency at the CWL.

20 Claims, 11 Drawing Sheets

INTRINSICALLY SAFE NDIR GAS SENSOR IN A CAN

CROSS REFERENCE TO RELATED APPLICATIONS

This application claims priority from, and is a continuation-in-part application of, U.S. Ser. No. 13/310,255, filed Aug. 15, 2011, which itself was a continuation-in-part application of U.S. Ser. No. 12/868,628, filed Aug. 25, 2010, which is now U.S. Pat. No. 8,003,945, the disclosures of all of which are specifically incorporated herein by reference.

FIELD OF THE INVENTION

The present application is in the field of gas analysis, and specifically relates to apparatus using a Non-Dispersive Infrared (NDIR) gas analysis technique to determine the concentration of a gas of interest that is present in a chamber by sensing the absorption of infrared radiation passing through the gas.

BACKGROUND OF THE INVENTION

We are living in a gaseous world and the type of gases surrounding our everyday life, for example in where we live, work or play, is vital to our well-being, safety, and even our very survival. Exposure to prolonged insufficient oxygen levels (~15% or less) can make us very sick or might even be fatal to us at times. Too much water vapor in the air surrounding us, especially when the temperature is very high (>90° F.), can make us very uncomfortable or seriously ill. For older folks, exposure to high humidity and very high temperature for prolonged periods of time can even be fatal. Unchecked exposure to, or unintentional breathing of, toxic gases above a certain high concentration level such as Carbon Monoxide (70-400 ppm), Hydrogen Sulfide (50-200 ppm), Formaldehyde (>50 ppb) etc., to name just a few, is extremely hazardous to one's health and often leads to unexpected deaths.

In order to prevent accidental or unintended exposure to unsafe levels of gases, humans have long devised, literally from centuries ago until today, various means of detecting all manners of gases, whether they are actually harmful to them or not. Today one can classify all the significant and still prevalent gas measurement techniques developed to date into two broad categories, namely, interactive and non-interactive types. Among the interactive types are electrochemical fuel cells, tin oxide ($SnO_2$) sensors, metal oxide semiconductor (MOS) sensors, catalytic (platinum bead) sensors, photo-ionization detectors (PID), flame-ionization detectors (FID), thermal conductivity sensors etc., almost all of which suffer from long-term output drifts, short life span and non-specificity problems. Non-interactive types include Non-Dispersive Infrared (NDIR), photo-acoustic and tunable diode laser absorption spectroscopy (TDLAS) gas sensors. Up and coming non-interactive techniques advanced only during the past two decades include the use of the latest micro electromechanical technologies such as MicroElectronic Mechanical Systems (MEMS) and the so-called Nanotechnology. However, probably a few more years have to pass before the potential of these new non-interactive type gas sensors is fully obtainable.

With so many gas detection techniques available over the years, one could easily be misled to believe that gas sensors today must be plentiful and readily available to people to avoid harmful exposure to unhealthy or toxic gases. Unfortunately, at the present time, this is far from being the truth. The reasons are constraints arising from sensor performance and sensor cost. As a result, gas sensors today are deployed for safety reasons only in the most critical and needed circumstances. An example can be cited in the case of the kerosene heater. A kerosene heater is a very cost effective and reliable appliance used all over the world for generating needed heat during the winter months. However, it can also be a deadly appliance when used in a space where there is inadequate ventilation. In such a situation, as oxygen is being consumed without adequate replenishment, the oxygen level in the space can drop to a point (<15 volume %) where it is injurious or even deadly to inhabitants if they are not adequately forewarned. Therefore, by law or code most every worldwide locales where kerosene heaters are used, this appliance must be equipped with a low oxygen level alarm sensor. Unfortunately, the lowest unit cost for such a sensor available today is only of the electrochemical type. Even so, the unit cost is still in the range of US$15-20. Furthermore, such a sensor is not even stable over time and has a life span of only 3-5 years, far shorter than the 15-20 years expected for the kerosene heater.

In short, gas sensors available to the public today for use to guard against accidental or unintended exposure to unhealthy or toxic gases are very limited and are invariably inadequate taking into consideration both performance and unit sensor cost. This situation will continue to prevail if no breakthrough gas sensor technology is forthcoming.

Although the Non-Dispersive Infrared ("NDIR") technique has long been considered as one of the best methods for gas measurement, at least from the performance standpoint as being highly specific, sensitive, relatively stable, reliable and easy to maintain and service, it still falls far short of the list of sensor features optimally or ideally needed today. This list of the most desirable gas sensor features will be briefly described below.

The first and foremost desirable feature of a gas sensor to be used for alerting people when they are faced with harmful or toxic gases exceeding a level limit is output stability over time or what is sometimes referred to as having a thermostat-like performance feature. This feature reflects, in essence, the reliability or trust in the use of the sensor. The experience of most people in the use of a thermostat at home is that they are never required, once the sensor is installed, to re-calibrate the sensor and its output stays accurate over time. Such is not the case for gas sensors at the present time. As a matter of fact, no gas sensor today has this desirable feature of having its output stay drift-free irrespective of any measurement technology used for its design and construction.

Gas sensors today have to rely upon periodic re-calibration or output software correction in order to be able to stay drift-free over time. Most recently, the present inventor advanced in U.S. patent application Ser. No. 12/759,603 a new NDIR gas sensing methodology which renders to first order the output of an NDIR gas sensor designed using this methodology virtually drift-free over time without the need for any sensor output correction software or periodic re-calibration. Thus, it appears hope now exists for the first time for achieving the first and foremost desirable feature of a gas sensor.

The next most desirable feature of a gas sensor is its sensitivity accuracy or its ability to accurately detect the gas of interest to a certain concentration level (e.g., so many ppb or ppm), even in a temperature or pressure hostile environment. Closely related to this feature is detection specificity, namely the capability of a gas sensor to detect the gas of interest free from any interference by other gases in the atmosphere. Another desirable feature of a gas sensor is its ruggedness or its ability to withstand reasonable mechanical abuse (such as a drop from a height of 4-5 feet onto a hard vinyl floor) without falling apart or becoming inoperable. A further desirable feature of a gas sensor is its size and weight, since it is generally desired that such a sensor be small and as lightweight as possible. Yet another desirable feature of a gas sensor is its operating life expectancy (and it is desirable that it have a life span of 15-20 years, or more). Last, but certainly not least, it is desirable that the unit cost of a gas sensor be low enough that it can be affordably applied anywhere. Other than sensor output stability over time, a low unit cost feature is by far the most important desirable feature of a gas sensor, but is also the most difficult to overcome.

It is amply clear that none of the gas sensors available for purchase and use by the general public today meet all of the desirable performance and low unit cost features outlined above. Nevertheless, the long-felt need to have such gas sensors available has not diminished one single iota. The object of the current invention is to advance a novel design for NDIR gas sensors, building upon U.S. patent application Ser. No. 12/759,603 by the present inventor, such that all the desirable features in sensor performance and sensor unit production cost, hitherto unavailable to the general public, can be attained.

The novel design of the present invention can be modified to increase its sensitivity. When this is done, the new design is especially well suited for applications requiring an intrinsically safe design. One such application is in the field of mining.

Coal and crude oil are two of the most important fossil fuels in use in the world today to satisfy our energy needs. Particularly in countries like the U.S. and China, where there are enormous deposits of coal in their land, mining of coal is even more important, if not indispensable. No doubt the acquisition of other energy sources such as gas and crude oil also involves dangerous everyday operations, but coal mining has to take the top spot as far as the number of workers that perish every year is concerned. It is believed that explosions in mines alone inside China have claimed more than half a million lives during the past decade. Although the number of miners killed elsewhere in the world during mining operations is far less than those reported inside China, the number still runs into many thousands every year.

The cause of explosions inside mines has become fairly well understood over the years. The presence of methane gas ($CH_4$) pockets is known to exist and scatter unpredictably among rocks containing coal deposits. Methane gas is odorless and the lower explosion limit (LEL) of methane gas is around 5.0 volume percent in air containing ~21 vol. % of oxygen. It is generally believed that underground mine explosions are caused by miners accidentally and unknowingly hitting a methane gas ($CH_4$) pocket in the mine while they are crushing and churning rocks by hand or with massive machines to get to coal deposits in tunnels. Without knowing the existence of an explosive air mixture in their work area so as to stop working immediately, the miners' operation continues to generate sparks that ultimately lead to the unfortunate explosion. Such underground mine explosions could surely be prevented if only the miners knew that immediate ambient air they are breathing has reached a lower explosion limit (LEL) for methane gas and they have to immediately stop operating their machines or rock churning by hand in order not to generate any sparks that could set off an explosion. Although methane gas sensors can detect LEL concentration levels for methane gas when such sensors are stationed at adequate distances inside mine tunnels, it is not always the case that such a sensor is in the immediate vicinity of the space where the miners are doing the heavy work. Without the presence of such a methane sensor in the space to warn the miners of such a dangerous situation where they work, underground mine explosions will inevitably occur from time to time causing the lives of many miners every year.

It has long been understood and believed that in order to eliminate the danger of underground mine explosions caused by the methane gas, one has to fulfill two important monitoring functions for mines. The first is an integrated communication and tracking system designed specifically for use in underground mines. Such a system not only is able to continuously track the exact whereabouts of the miners underground, it is also capable of monitoring in real time the outputs of all the installed gas sensors stationed inside the mine in order to be able to assess at all times any dangerous levels of gas built-ups at locations that might trigger an explosion. Over the past decade a small number of such integrated communication and tracking systems have become available. Within the last couple of years, some of them have even been installed for testing in a small number of mines around the world. For tracking individual miners working underground, an effective way is to install wireless location sensors in the helmets of miners that communicate directly with the central system above ground. The whereabouts of individual miners underground can now be continuously tracked and notified if necessary to evacuate from specific locations in case of potential danger.

But while the availability of such an integrated communication and tracking system for mines is a necessary requirement for eliminating the danger of underground mine explosions, it is not sufficient by itself to eliminate such danger. The reason is relatively straightforward. Although an expertly functioning communication and tracking system can pin point the location of a potentially explosive environment via monitoring of a fixed system of methane sensors strategically scattered throughout the tunnels of the mine, it cannot follow the exact locale of a crew of miners underground at work. If the crew cannot sense the danger of an explosive environment they find themselves in while they are working, an explosion can still occur. However, if the crew is provided with means to accurately and reliably detect the dangerous level of methane in their midst, they can immediately take action to avoid the possibility of explosions and evacuate the site. Meanwhile the central system can also take note of the dangerous condition at this location and notify other miners nearby to evacuate until the environment is under control and is safe again.

The ability of an integrated communication and tracking system for mines to pin point the whereabouts of every miner working underground can be achieved via installation of a wireless location sensor in the helmet of each of these miners. Imagine that the helmet of every miner working underground is also equipped with a wireless and intrinsically safe methane sensor capable of accurately detecting a dangerous level of methane (like the LEL) in the vicinity of working miners; in this scenario, the second important monitoring function necessary and sufficient to eliminate the danger of underground mine explosions mentioned will be fulfilled.

However, despite a long felt need for increased mine safety, and the imperative of saving miner's lives, an integrated communication and tracking system for mines does not yet exist, at least not with a methane sensor that can adequately function in such a system. This invention fulfills this long felt need by providing an intrinsically safe methane sensor that satisfies the criteria necessary for a methane sensor to be effectively and economically integrated into a communication and tracking system for mines.

This invention also provides an intrinsically safe NDIR gas sensor in a can that is an improvement over my earlier disclosed inventions acknowledged above in cross reference to related applications.

SUMMARY OF THE INVENTION

The present invention is generally directed to an NDIR gas sensor that is housed within a mechanical housing made up of a can mounted to a header housing (preferably metal) and a sample chamber mounted above the can. The can has a pair of windows formed in it to allow radiation to enter into and return from the sample chamber. A signal detector, a reference detector, an infrared source (such as a MEMS source) and a signal processor are contained in an electronics module mounted within the can (preferably on a PCB). The sample chamber creates a signal channel path length detected by the signal detector that is greater than a reference channel path length detected by the reference detector and an absorption bias between the signal and reference outputs can be used to determine a gas concentration in the sample chamber. Both the signal detector and the reference detector have an identical narrow band pass filter with the same Center Wavelength ("CWL"), Full Width Half Maximum (FWHM) and transmittance efficiency at the CWL.

In a first, separate group of aspects of the present invention, the header is sealed to the can so as to create a hermetically sealed environment containing the electronics module.

Accordingly, it is a primary object of the present invention to advance an improved NDIR gas sensor that implements an Absorption Biased methodology for NDIR gas sensors in an intrinsically safe design.

These and further objectives and advantages will be apparent to those skilled in the art in connection with the drawings and the detailed description of the invention set forth below.

DETAILED DESCRIPTION OF THE INVENTION

Figure 1:
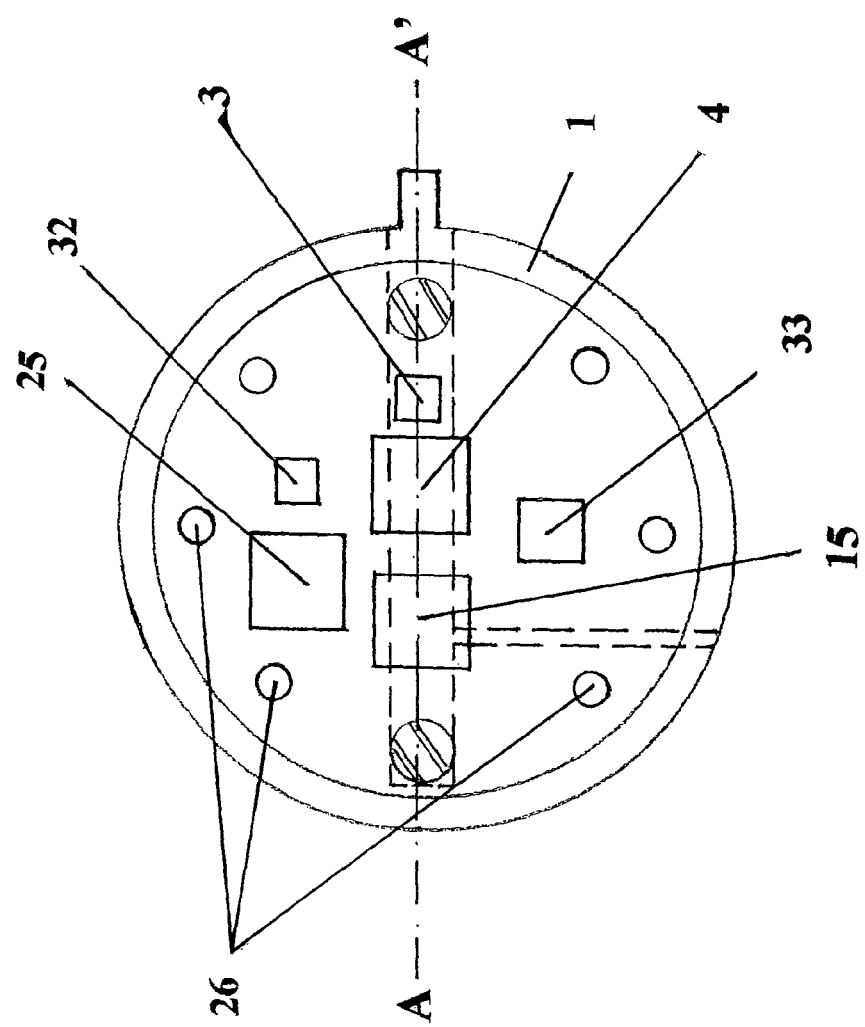
FIG. 1 depicts the placement of all the optoelectronic components of an earlier invention on top of a detector header forming the bottom half of the sensor housing in accordance with the teachings of U.S. Pat. No. 8,003,945.

The present invention provides a novel NDIR gas sensor for implementing the recently invented Absorption Biased methodology for NDIR gas sensors described in U.S. patent application Ser. No. 12/759,603, the disclosure of which is specifically incorporated herein by reference.

The Absorption Biased methodology for NDIR gas sensors follows the general design principle of a dual-channel implementation, namely a signal and a reference channel working in synchronism as a ratio for signal processing. However, in Absorption Biased methodology both the signal and the reference detectors for the two channels are equipped with an identical narrow bandpass spectral filter having the same Center Wavelength (CWL), Full Width Half Maximum (FWHM) and transmittance efficiency at CWL. Furthermore, both detectors receive infrared radiation from one single source. In order for the methodology to work properly, it is especially preferred that the two separate detectors, with their individual detector element and identical spectral filter, share a common thermal platform because the individual spectral filters are extremely temperature sensitive and sharing a common thermal platform allows these components to track in temperature at all times.

My earlier invention set forth in U.S. Pat. No. 8,003,945 advances an innovative sensor housing for implementing the so-called Absorption Biased methodology for NDIR gas sensors referred to above and interactively combining all the needed opto-electronic, opto-mechanical and electronic components together into a functioning gas sensor network occupying a physical space not more than just a few cubic centimeters. A mechanical housing unit, used commonly for the packaging of thermopile detectors, has a metallic header ~0.500" in diameter and ~0.150" thick fitted with a metal can typically 0.250" tall that can be welded onto the header for creating a hermetically sealed environment, is used to accommodate all the needed opto-electronic, opto-mechanical and electronic components for constituting a fully functional NDIR gas sensor.

In order to achieve this, all the needed opto-electronic, opto-mechanical and electronic components must be specially designed and fabricated, not only to fit the overall sensor housing for assembly, but also to be able to interact functionally together as a gas sensor unit. There are three such opto-electronic components, namely two Integrated Detector Filter ASIC (IDFA) modules and a MEMS Infrared Source (MIS) module. The IDFA module comprises a thermopile detector with a selectable thin film narrow bandpass filter mounted on top communicable with an Application Specific Integrated Circuit (ASIC) such that infrared radiation received by the detector after passing through the narrow bandpass filter is converted into a digital signal ready to be transmitted to a CPU die for signal processing. The MIS module is simply an infrared MEMS source such that it emits radiation when power is applied to it.

There are three electronic components that have to be specially designed for my earlier disclosed invention. The first one is a wire-bondable CPU die which can digitally receive, process and output information wired to its input and output pads. Included in this CPU die is also a temperature sensor. The second custom component is a wire-bondable electrical heater die which is used to supply needed heat to temperature regulate the sensor housing if required. The third custom component is a wire-bondable voltage regulator die which translates available input voltage levels to those that are required to power the opto-electronic components (see above), the CPU die and the heater die.

Finally, there are two opto-mechanical components that have to be specially designed for my earlier disclosed invention. The first one is the mechanical housing comprising two separate components, namely, the can and the header of a detector housing typically used to package infrared detectors such as a thermopile. The can is designed to function as mirrors comprising various reflecting surfaces to direct and re-direct radiation above and below the header through openings in the header body covered by optical windows. The body of the header is designed to have tunnels acting as sample chambers for the sensor as radiation is directed downward to and upwards from them through the openings covered by optical windows. These tunnels in the header body are also designed to communicate with the outside air through openings on the side of the header. Covering each of these openings is a thin layer of polyethylene functioning as an air filter in the form of a rubber-band-like ring encircling the edge of the can that is welded onto the header body.

U.S. Pat. No. 8,003,945 describes how these specially designed components are assembled together into a mechanical embodiment such as a conventional detector housing to perform functionally as a superb NDIR gas sensor.

However, before further specifics of my earlier invention are discussed, it is worth noting that U.S. Pat. No. 8,003,945 advances a new NDIR gas sensor design to revolutionize the gas sensor industry by creating an intrinsically safe gas sensor that is essentially explosion-proof that can be used to replace existing electrochemical sensors with an essentially drift-free and detection specific NDIR gas sensor. It is essentially explosion-proof because its source and electronics and power source (if present) are all self-contained within a hermetically sealed environment containing a non-reactive gas, such as nitrogen. Thus, the benefits of NDIR gas sensors can now be obtained in applications in which electrochemical sensors were previously used.

Moreover, gas sensors according to U.S. Pat. No. 8,003,945 can be designed to replace current electrochemical sensors that must be replaced on a regular basis. And, in a special advantage of U.S. Pat. No. 8,003,945, it is worth noting that gas sensors according to that invention can detect carbon dioxide ($CO_2$) whereas electrochemical cells cannot detect $CO_2$ because their end product is $CO_2$. Thus, gas sensors according to U.S. Pat. No. 8,003,945 can now be used in many applications in which electrochemical sensors could not function, while still competing with such sensors in terms of cost.

My earlier invention in U.S. Pat. No. 8,003,945 was described in even greater detail by reference to FIGS. 1-5 and one especially preferred earlier embodiment. Although the Figures are described in greater detail below, the following is a glossary of the elements identified in the Figures.

Figure 2:
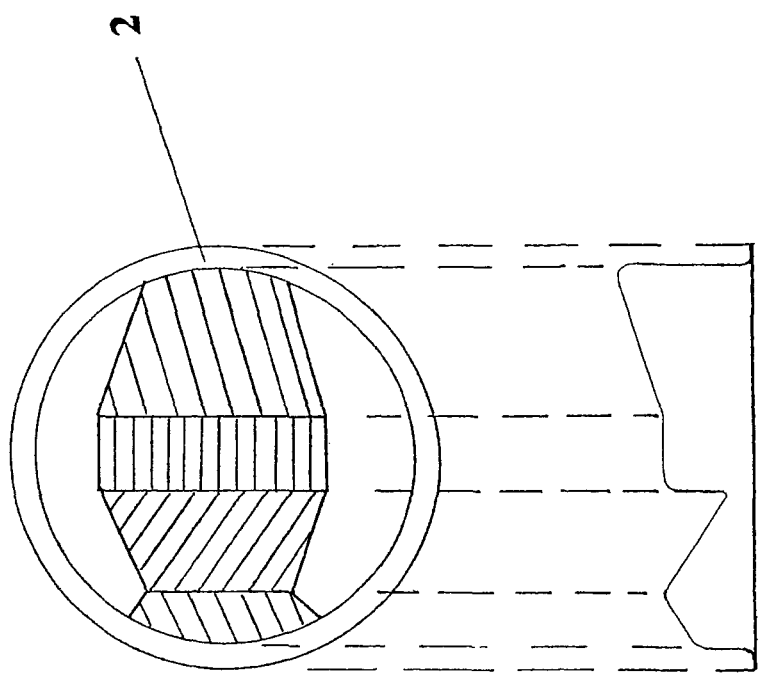
FIG. 2 depicts schematically the detector can of FIG. 1 with its custom reflecting surfaces impregnated inside its top constituting the top half of the sensor housing of the present invention.
Figure 3:
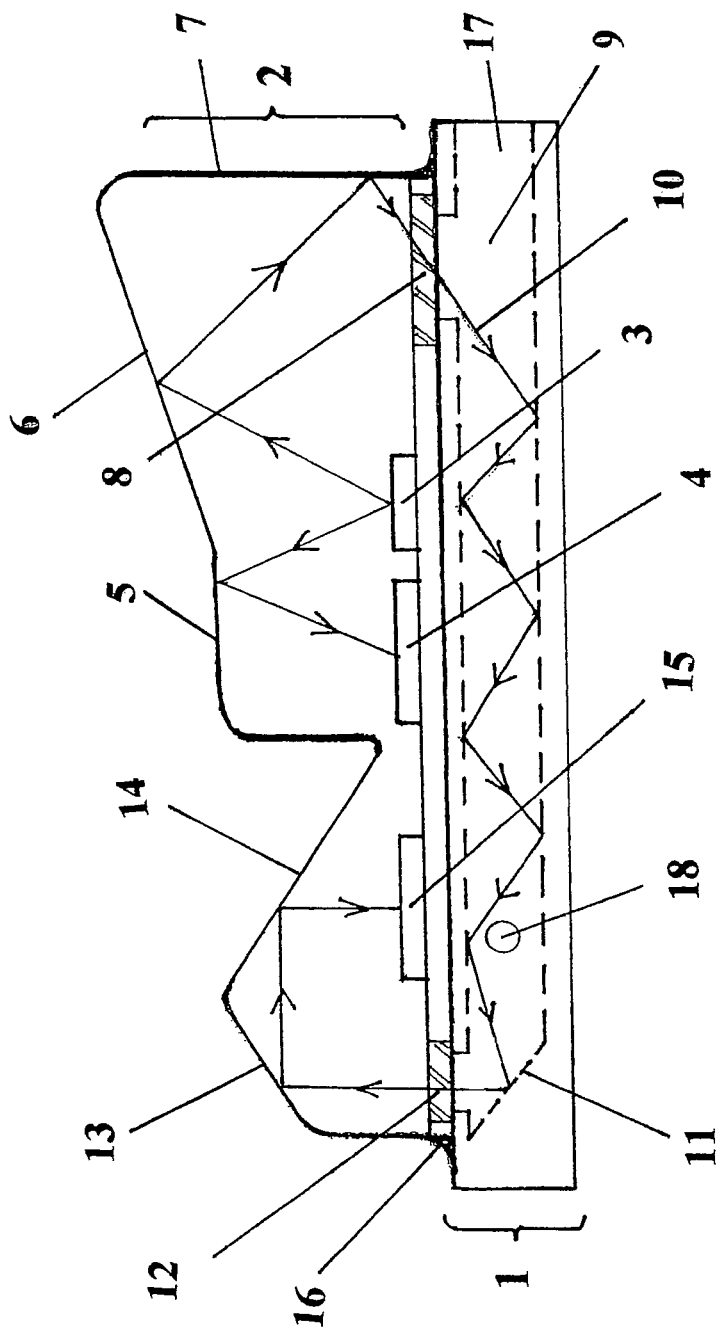
FIG. 3 depicts a cross-sectional view of the sensor housing along AA' of FIG. 1 when the top half and the bottom half of the sensor housing are welded together to form the entire body of a fully functional NDIR gas sensor.

1 detector header housing
  2 detector can
  3 MEMS module
  4 detector module
  5 reflecting surface (in the Reference channel)
  6 reflecting surface
  7 reflecting surface
  8 window
  9 tunnel waveguide sample chamber
  10 radiation
  11 mirror
  12 window
  13 reflecting surface
  14 reflecting surface
  15 detector module
  16 welding joint
  17 tunnel opening
  18 port opening
  19 thermopile detector
  20 narrow bandpass interference filter
  21 Application Specific Integrated Circuit ("ASIC")
  22 infrared radiation
  23 wire bondable pad
  24 surface mountable pad
  25 platinum film
  26 lead
  27 platinum film
  28 heater resistive structure
  29 thin $Si_3N_4$ membrane
  30 silicon substrate cavity structure
  31 wire bondable pad
  32 wire bondable voltage regulator die
  33 heater die
  34 battery FIG. 1 shows the placement and arrangement of all the optoelectronic components on top of the detector header housing 1 forming the bottom half of the sensor assembly for one of my earlier inventions. FIG. 2 shows schematically the detector can 2 with its reflecting surfaces impregnated inside its top constituting the top half of the sensor assembly of that invention. FIG. 3 depicts a cross-sectional view of the sensor assembly (along AA' of FIG. 1) when the detector can 2 (see FIG. 2) is welded to the detector header 1 (see FIG. 1) forming the entire body of a fully functioning NDIR gas sensor.

With reference to FIG. 3, part of the infrared radiation emanating from the MEMS module 3 (see also FIG. 1) is reflected onto detector module 4 via reflecting surface 5 constituting the Reference. Another part of the infrared radiation emanating from MEMS module 3 enters via reflecting surfaces 6 and 7 and also window 8 (see FIG. 3) into the tunnel waveguide sample chamber 9 of the detector header housing 1 constituting the Signal channel of the currently invented NDIR gas sensor. The radiation 10 propagating inside the tunnel sample chamber 9 emerges at the other end via a 45° mirror 11, formed inside the tunnel, and window 12. The emerging radiation 10 is directed by reflection surfaces 13 and 14 of the detector can housing 2 onto detector module 15. The formation of the Reference and Signal channels by the optoelectronic and optomechanical components follows the teaching of the Absorption Biased methodology for NDIR gas sensors as disclosed in U.S. application Ser. No. 12/759,603 by the present inventor.

As can be seen from FIG. 3, since the space between the detector can housing 2 and the detector header housing 1 is sealed off from the ambience by the welding joint 16 (see FIG. 3) and windows 8 and 12 and is filled with 100% Nitrogen, the Reference channel does not feel any effect from ambient $CO_2$ present in the tunnel sample chamber 9 which is in communication with the ambience outside through openings 17 and 18. (Opening 17 is a channel opening shown in FIG. 1 while opening 18 is a port opening shown in FIG. 3.) On the other hand, infrared radiation emanated by the MEMS module 3 for the Signal channel passes through the tunnel sample chamber 9 prior to reaching detector module 15. Therefore the Signal channel is sensitive to the presence of any $CO_2$ gas in the surrounding ambience which is in communication with the tunnel sample chamber 9 via openings 17 and 18.

Figure 4:
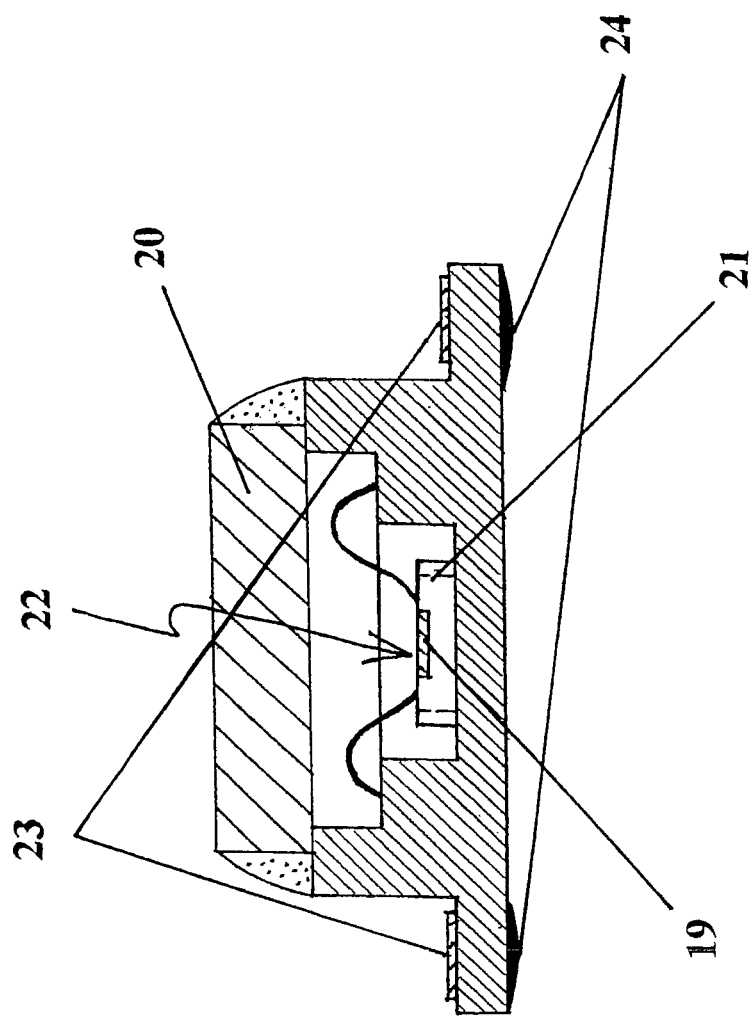
FIG. 4 depicts the detail for the construct of the detector module which is a digital sensor device comprising a thermopile detector, a narrow bandpass interference filter and an Application Specific Integrated Circuit (ASIC) electrically integrated together as a functioning unit.

The roles played by the optoelectronic components for performing the signal processing function of my earlier y invented NDIR gas sensor will now be described. With reference to FIG. 1, Detector module 4 of the Reference channel and Detector module 15 of the Signal channel are identical devices. Such a detector module is in essence a digital sensor designed to be a surface mountable or wire bondable integrated circuit device comprising a thermopile detector 19, a narrow bandpass interference filter 20 fabricated on top and an Application Specific Integrated Circuit (ASIC) 21 all electrically interconnected as depicted in FIG. 4. With reference to FIG. 4, infrared radiation 22 incident on the thermopile detector 19 after passing through the filter 20 will be processed by ASIC 21 with the resulting signal available digitally for further processing elsewhere via wire bondable pads 23 or surface mountable pads 24. Thus both the Reference channel and the Signal channel signals are processed respectively by Detector modules 4 and 15 with the resulting signals forwarded to a wire bondable CPU die 25 (see FIG. 1) for further processing. The final outputs of the gas sensor are transmitted to the outside world from the CPU die 25 through 2 or more leads 26 of the detector header housing 1 (see FIG. 1).

Figure 5:
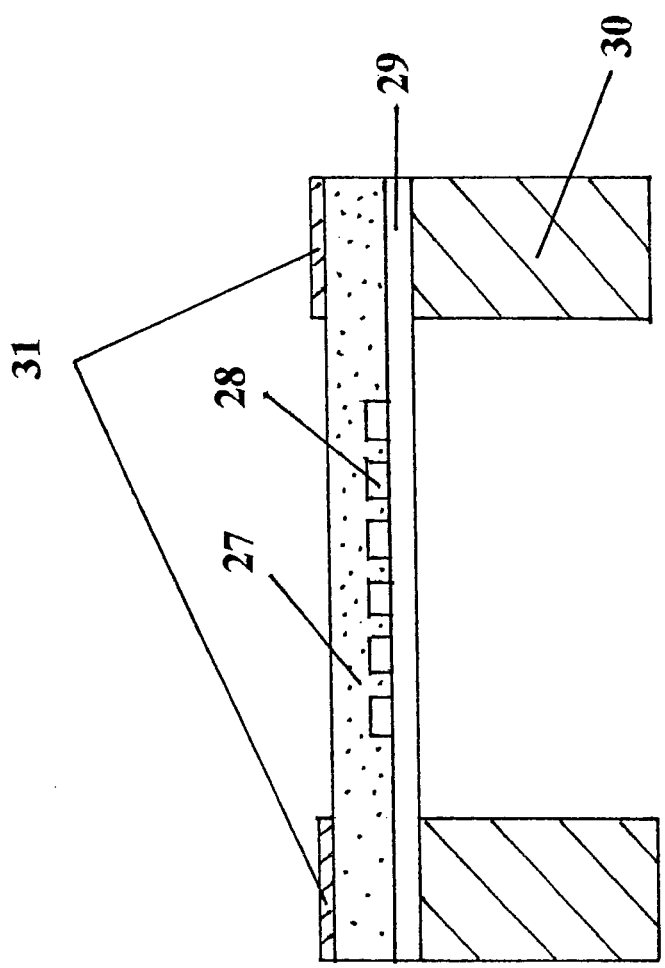
FIG. 5 depicts the detail of the MEMS module which is basically an all solid-state micro hot plate fabricated on a thin micro-machined membrane supported by a silicon cavity structure.

The MEMS module 3, as depicted in FIG. 1, is a wire bondable microelectronic device which acts as the source of infrared radiation for the gas sensor as depicted in FIG. 5. Basically it is an all solid state micro hot plate fabricated on a thin micro-machined membrane. A high emissivity layer of black platinum film 27 is deposited onto a heater resistive structure 28 supported by a thin $Si_3N_4$ membrane 29 which is part of a silicon substrate cavity structure 30 as shown in detail in FIG. 5. When voltage is applied through the wire bondable pads 31, the heater resistive structure 28 gets hot very quickly and depending upon how much and how long voltage is applied to the device, the heater resistive structure 28 acts like a near perfect blackbody source with emissivity approaching unity. As shown in FIG. 3, infrared radiation from the MEMS module 3 is directed via the reflecting surfaces of detector can housing 2 to detector modules 4 and 15 constituting, respectively, the Reference and Signal channels of the currently invented ZD NDIR gas sensor fuse. It should be noted that the reflectivity of reflecting surfaces of detector can housing 2 can be enhanced, if desirable, by known means such as deposition of metals (e.g., chrome or gold). Similarly, the reflectivity of tunnel sample chamber 9 can also be enhanced in the same fashion, or only it may be so enhanced, depending upon the needs of a particular gas sensor made in accordance with my earlier teachings.

All voltages needed to drive the optoelectronic components mounted on the detector header housing 1 are derived from a wire bondable voltage regulator die 32 (see FIG. 1). Voltage regulator die 32 is fed by an external voltage source via leads 26 of the detector header housing 1. The output from the voltage regulator die 32 is first connected to the CPU die 25 which then supplies the other optoelectronic components, viz. detector modules 4 and 15, the MEMS module 3 and also a heater die 33 (see FIG. 1) which could be used to regulate the internal temperature of the space between the detector header housing 1 and the detector can housing 2. In addition to receiving power from the CPU die 25, the heater die 33 is also directly controlled by the CPU dies 25. In an optional embodiment, such as when it is desired that a power source be self-contained within the gas sensor, a battery 34 can be mounted on the detector header housing 1 as shown in FIG. 1.

An alternative embodiment of my earlier invention which provides greater sensitivity will now be disclosed.

This invention also proposed a solution to the problem of methane sensors in an underground mining communication and tracking system by using a methane sensor which is in actuality a methane fuse capable of sounding a signal or alarm when a dangerous and predetermined concentration level of methane is exceeded. Since the LEL of methane in regular air containing approximately 21.0 volume percent of oxygen is 5.0 volume percent or 50,000 ppm, the alarm level for a methane fuse can be safely set at 1.0 volume percent or 10,000 ppm.

In order for such a methane fuse to be useful and effective it should satisfy many stringent performance requirements, all of which are met by a methane fuse according to my earlier invention. First and foremost, it must be intrinsically safe to be able to be operated inside a mine without itself causing any potential explosions. Second, its output must stay accurate over time and if there should be an unavoidable output drift over time, it must be able to be checked and if necessary be recalibrated back to accuracy effortlessly and in a matter of 1-2 minutes or less. That way it becomes possible for a miner to check this methane fuse every time the miner re-enters the mine for work underground. Third, its methane measurement sensitivity and accuracy must be better than +/−250 ppm with a response time (0-90%) of 10 seconds or less and its output correctable for temperature changes in order to be able to forewarn miners with time to spare before a LEL level of methane is reached. Fourth, this methane fuse must be small in size so it can easily be installed in a miner's helmet. Fifth, it must be rugged, completely solid state and shock resistant. Sixth, its output must be interference free from other common gases present underground so as not to cause any costly false alarms. Seventh, it must consume only a very small amount of power so that its continuous operation can last for at least a miner's work shift underground while sharing the same battery powering the lamp in his helmet. Eighth, its function must be compatible with the integrated communication and tracking system for the mine so that its alarm can also be heeded at the central station in addition to being heeded by the miner wearing it in the miner's helmet. Last but not least, it must be very low cost so that it can be installed in every miner's helmet.

Figure 6:
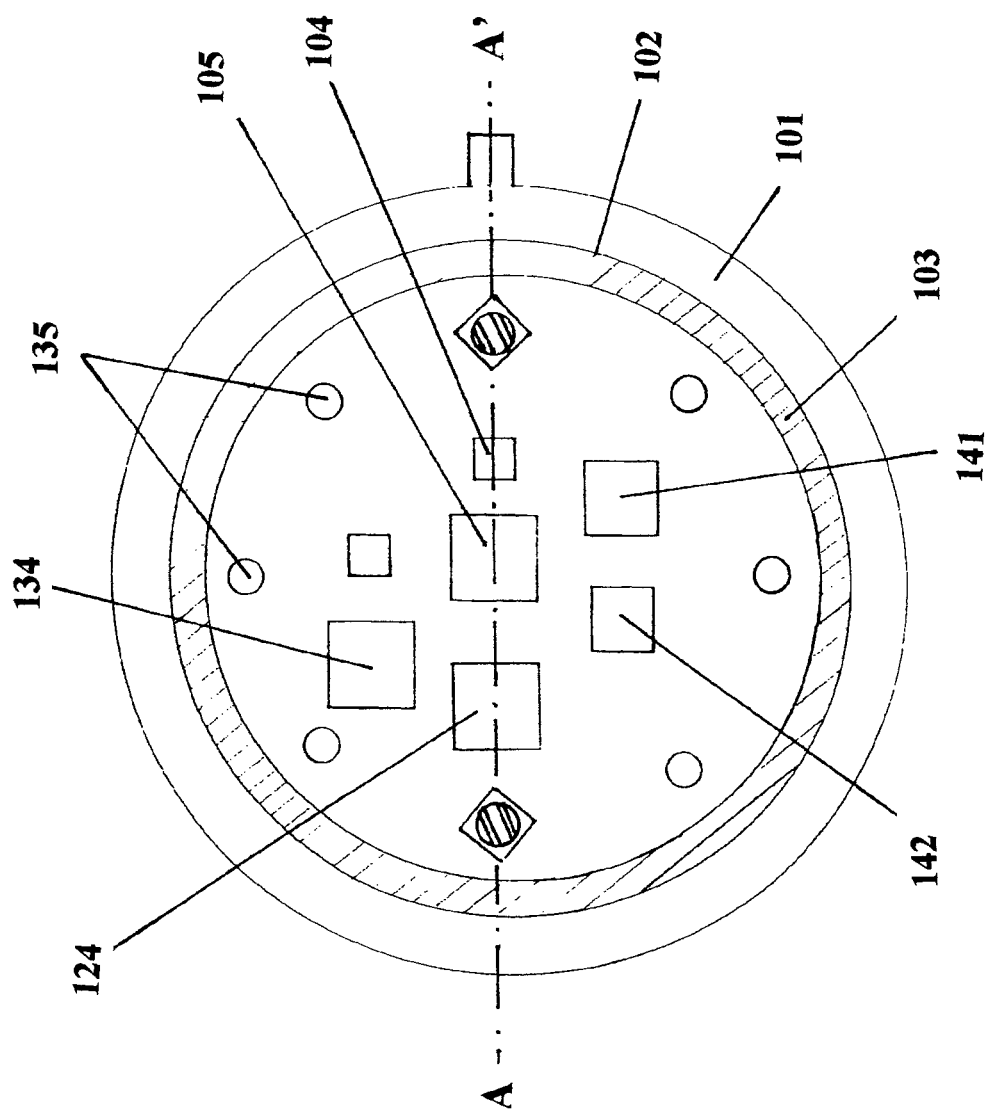
FIG. 6 depicts the placement of all the optoelectronic components on top of a detector header forming the top two-third section of a sensor housing according to the teachings of U.S. Ser. No. 13/310,255 that provides greater sensitivity.
Figure 7:
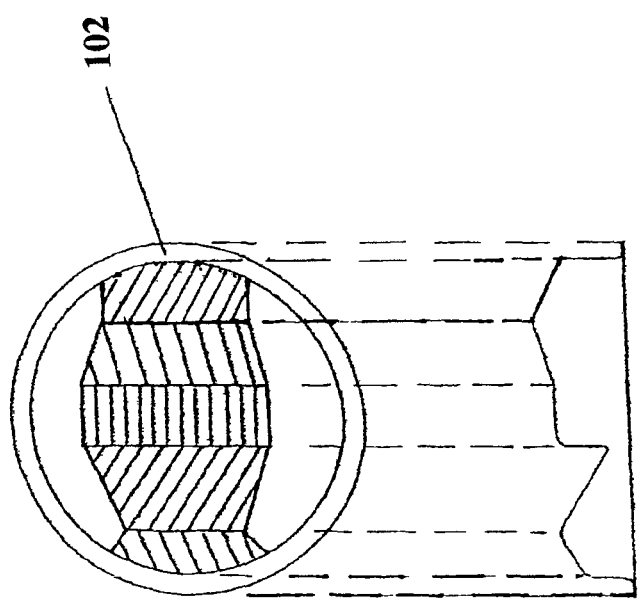
FIG. 7 depicts schematically the detector can of FIG. 6 with its custom reflecting surfaces impregnated inside its top constituting the top one-third of the sensor housing of the present invention.
Figure 8:
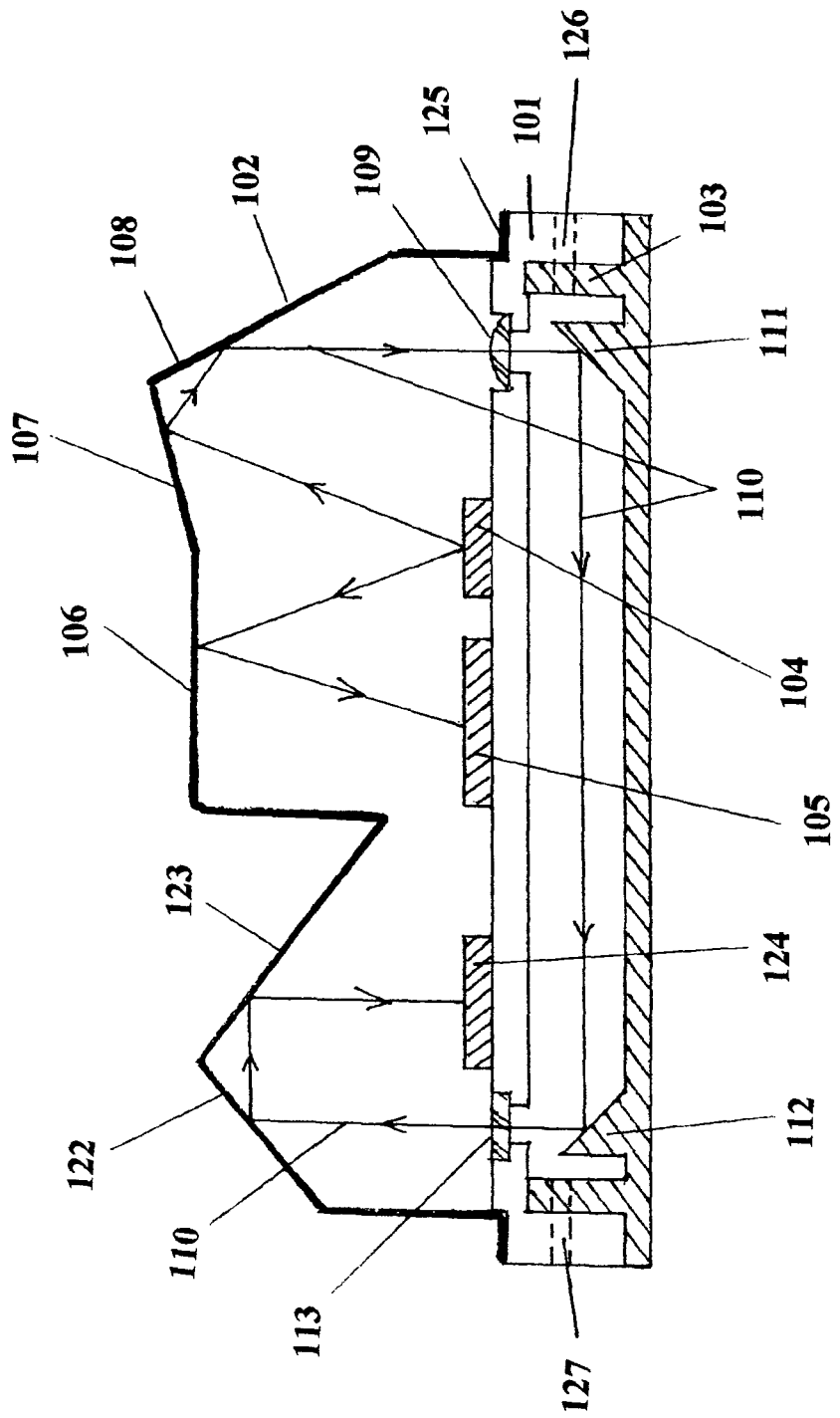
FIG. 8 depicts a cross-sectional view of the sensor housing along AA' of FIG. 6 when the top can, the middle header and the bottom dish sample chamber of the sensor housing are welded together to form the entire body of a fully functional NDIR gas sensor.

For an NDIR gas sensor designed as an intrinsically safe can to be used as a methane fuse in a mine with a sensitivity of at least +/−250 ppm of methane it must have a much longer path length that can be achieved through use of an alternative embodiment of my earlier invention that is depicted in FIGS. 6-8. Although FIGS. 6-8 are described in greater detail below, the following is a glossary of the elements identified in the Figures.

101 detector header housing
102 detector can
103 custom dish sample chamber
104 MEMS module
105 detector module
106 reflecting surface (in the Reference channel)
107 reflecting surface 108 reflecting surface
109 lens
110 radiation
111 mirror
112 mirror
113 window
114 reflecting surface
115 reflecting surface
116 reflecting surface
117 reflecting surface
118 reflecting surface
119 center of mirror 111
120 center of mirror 112
122 reflecting surface (in the Signal channel)
123 reflecting surface (in the Signal channel)
124 detector module
125 welding joint
126 opening
127 opening
128 thermopile detector
129 narrow bandpass interference filter
130 Application Specific Integrated Circuit ("ASIC")
132 wire bondable pad
133 surface mountable pad
134 wire bondable CPU die
135 lead
136 platinum film
137 heater resistive structure
138 thin $Si_3N_4$ membrane
139 silicon substrate cavity structure
140 wire bondable pad
141 wire bondable voltage regulator die
142 heater die FIG. 6 shows the placement and arrangement of all the optoelectronic components on top of detector header housing 101 forming the middle section of the sensor assembly for this alternative embodiment invention disclosed in U.S. Ser. No. 13/310,255. FIG. 7 shows schematically detector can 102 with its reflecting surfaces impregnated inside its top constituting the top third of the sensor assembly of that invention. FIG. 8 depicts a cross-sectional view of the sensor assembly (along AA' of FIG. 6) of that invention when the detector can 102 and the custom dish sample chamber 103 are welded to the detector header 101 (see FIG. 6) forming the entire body of a fully functioning NDIR gas sensor.

With reference to FIG. 8, part of the infrared radiation emanating from MEMS module 104 is reflected onto detector module 105 via reflecting surface 106 constituting the Reference channel of the presently invented NDIR gas sensor fuse. Another part of the infrared radiation emanating from MEMS module 104 enters perpendicularly via reflecting surfaces 107 and 108 through lens 109 (see FIG. 8) into the custom dish sample chamber 103 constituting the Signal channel of the presently invented NDIR gas sensor fuse. The function of lens 109 is to render the radiation beam entering custom dish sample chamber 103 relatively or substantially collimated. The radiation 110 entering dish sample chamber 103 is bent 90° by mirror 111 integral with dish sample chamber 103 so that radiation 110 is now propagating parallel to the top surface of the header. After bouncing around dish sample chamber 103 a designed number of times (see later), radiation 110 exits dish sample chamber 103 perpendicularly via mirror 112 and window 113 back into the space above the detector header 101.

Figure 9:
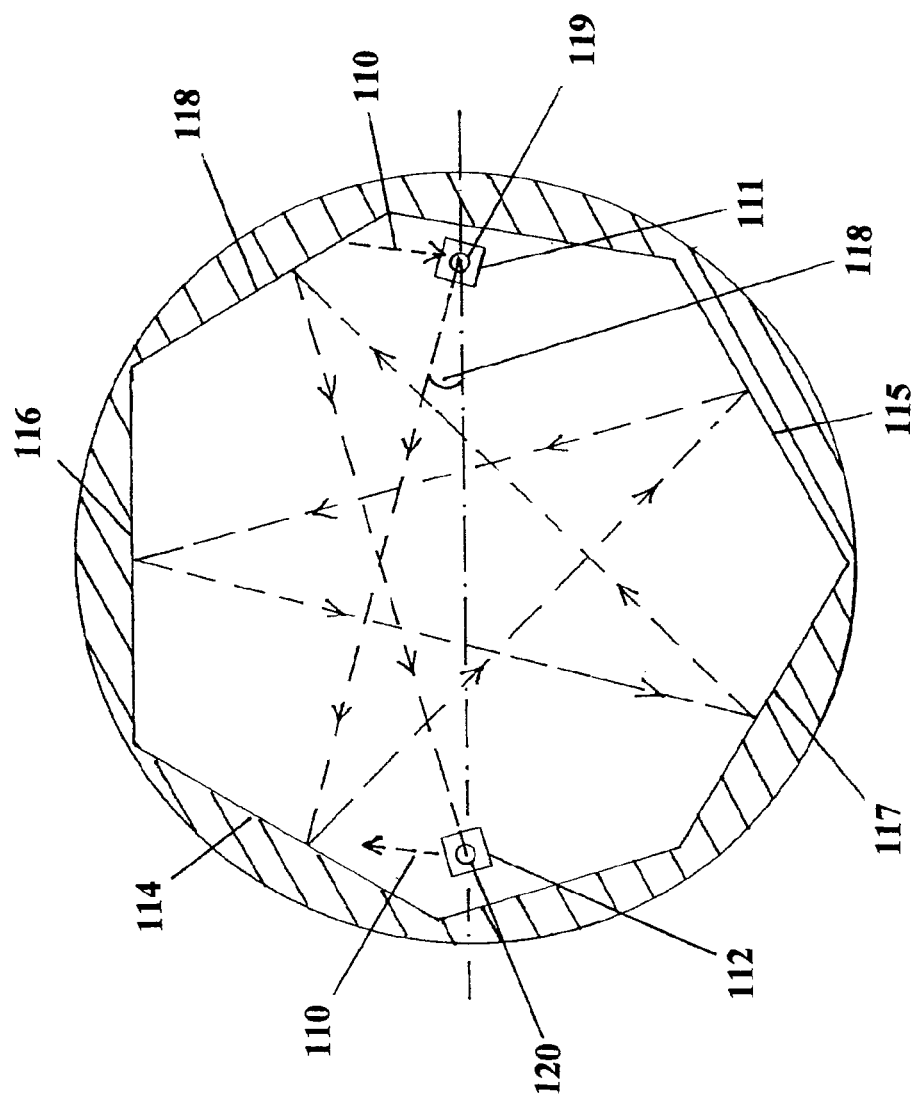
FIG. 9 depicts the bottom of a custom dish sample chamber according to an alternative preferred embodiment of the present invention showing the orderly multiple bouncing of the radiation in order to achieve a much longer path length for the sensor.

FIG. 9 shows a bottom view of custom dish sample chamber 103. As shown in FIG. 9, radiation 110 entering dish sample chamber 103 perpendicular to it is being bent 90° by mirror 111 towards reflecting surface 114. Radiation 110 is now rendered parallel to the bottom of dish sample chamber 103. After respectively bouncing off reflecting surfaces 114 through 118, radiation 110 is bent 90° by mirror 112 towards window 113 and re-enters the space above header surface 101. The custom dish sample chamber 103 as shown in FIG. 9 is specially designed with mirrors 111 and 112 oriented by an angle 118 equal to 15° with respect to the axis adjoining their respective centers 119 and 120. This particular design yields an effective sample chamber path length roughly six times the diameter of the header housing. Since the diameter of the header housing is roughly 0.5", the effective path length for such a dish sample chamber is ~3.0" which is sufficient to achieve a detection sensitivity of +/−250 ppm for methane gas. Thus, one can configure the number of reflecting surfaces to achieve a desired path length that is substantially greater than what could be achieved without reliance upon multiple reflections off multiple reflecting surfaces, as is shown in FIG. 9, depending upon the path length needed for a given NDIR sensor application.

Emerging radiation 110 (see FIG. 8) is then directed by reflection surfaces 122 and 123 of detector can 102 onto detector module 124. The formation of the Reference and Signal channels by the optoelectronic and optomechanical components follows the teaching of the Absorption Biased methodology for NDIR gas sensors as disclosed in U.S. application Ser. No. 12/759,603 by the present inventor.

As can be seen from FIG. 8, since the space between detector can 102 and detector header 101 is sealed off from ambience by welding joint 125 (see FIG. 7), lens 109 and window 113 and is filled with 100% Nitrogen, the Reference channel does not feel any effect from ambient gas of interest to be detected (e.g. $CO_2$ or methane) present in the custom dish sample chamber 103 which is in communication with the outside ambient atmosphere through openings 126 and 127. On the other hand, infrared radiation emanated by MEMS module 104 for the Signal channel enters custom dish sample chamber 103 and bounces inside it a designed number of times in order to acquire a long path length prior to reaching detector module 124. Therefore the Signal channel will be sensitive to the presence of any gas of interest to be detected in the surrounding ambience which is in communication with the disk sample chamber 103 via openings 126 and 127.

The roles played by the optoelectronic components for performing the signal processing function are the same as for U.S. Pat. No. 8,003,945.

As shown in FIG. 8, infrared radiation from MEMS module 104 is directed via the reflecting surfaces of the detector can housing 102 to detector modules 105 and 124 constituting, respectively, the Reference and Signal channels of the NDIR gas sensor fuse.

I will now turn to the new invention that is the subject of this current disclosure.

This invention follows the teachings of my earlier inventions described in U.S. Pat. No. 8,003,945 and U.S. Ser. No. 13/310,255 with respect to an intrinsically safe NDIR gas sensor manufactured in a can using a mechanical housing having a header, an infrared source (preferably a MEMS source), a reference detector, a signal detector and a microprocessor, wherein each of the reference detector and the signal detector have an identical narrow band pass filter with the same Center Wavelength ("CWL"), Full Width Half Maximum (FWHM) and transmittance efficiency at the CWL; however, in the present invention, the mechanical housing is constructed so that a sample chamber is formed on top of the header as is shown in FIG. 11.

Figure 10:
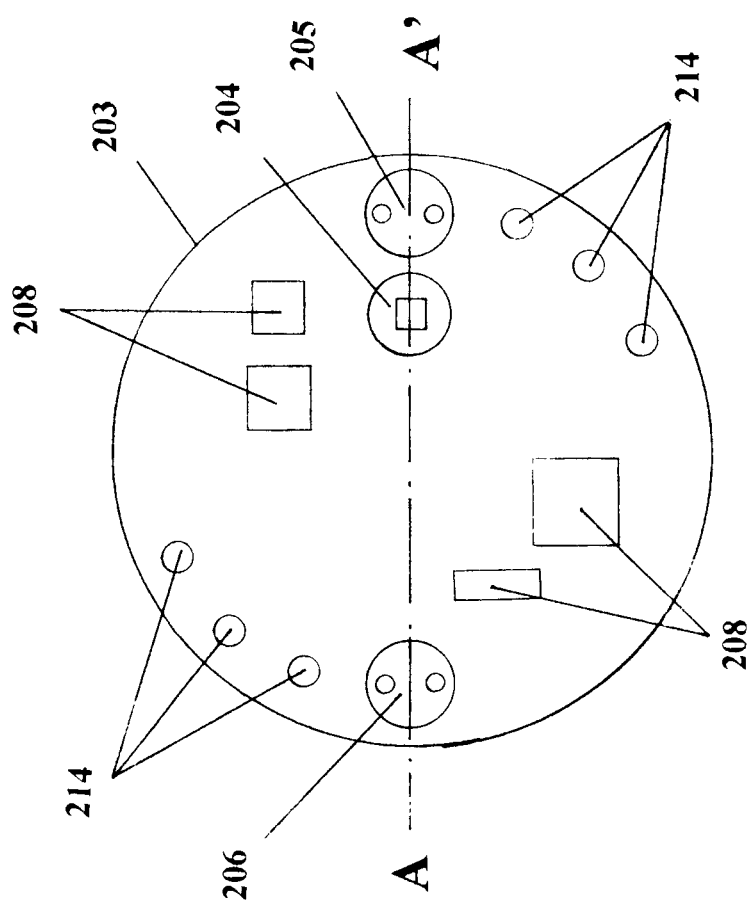
FIG. 10 is a printed circuit board layout showing all of the components mounted on it to be mounted inside the header and can detector housing.
Figure 11:
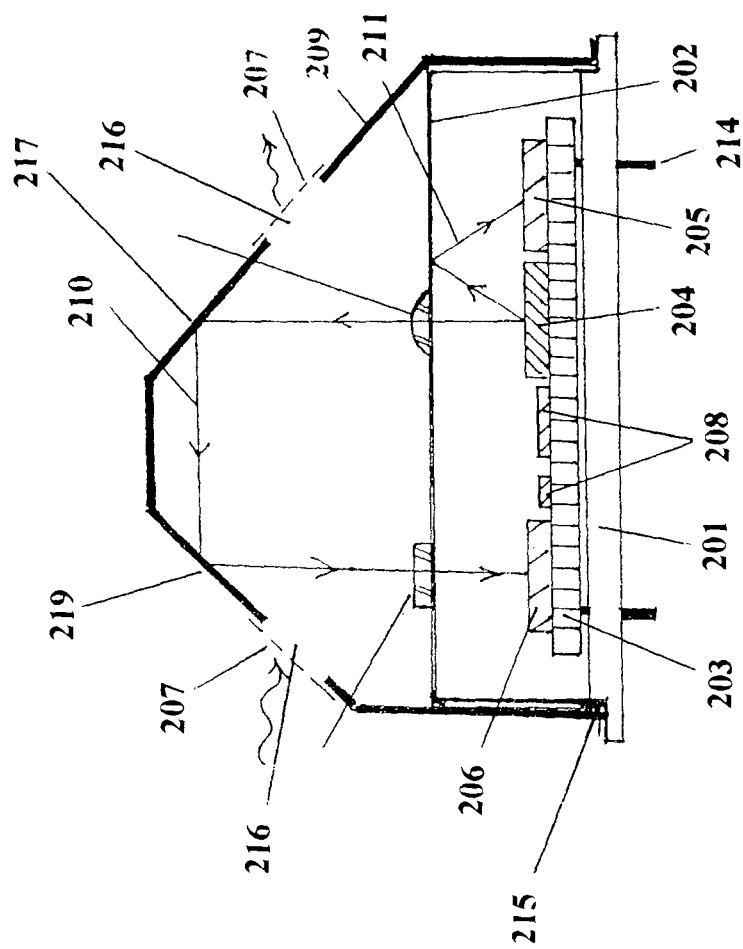
FIG. 11 depicts a cross-sectional view of the sensor along AA' of FIG. 10 when the header and the can housing are welded together with the sample chamber installed onto the top of the can.

The following is a glossary of the elements identified in FIGS. 10 and 11:
- 201 detector header housing
- 202 detector can
- 203 printed circuit board
- 204 MEMS module
- 205 detector module (in the Reference channel)
- 206 detector module (in the Signal channel)
- 207 filter
- 208 electronic component
- 209 sample chamber
- 210 Signal beam
- 211 Reference beam
- 212 lens
- 213 window
- 214 header leads
- 215 welding joint
- 216 opening
- 217 reflecting surface of sample chamber 209
- 218 reflecting surface of can 202
- 219 reflecting surface of sample chamber 209

FIG. 10 shows the placement and arrangement of all the optoelectronic components mounted on a printed circuit board to be installed inside the detector header housing 201 and can 202 of FIG. 11. In an especially preferred embodiment detector header housing 201 is a B1415 Series header and all of the components of the electronics module are mounted in a printed circuit board 203 mounted on it. FIG. 11 depicts a cross-sectional view of the sensor assembly (along AA' of FIG. 10) when the detector header 201 and can 202 are welded together with the custom sample chamber 209 installed on top of can 202 to form the entire body of a fully functioning NDIR gas sensor.

With reference to FIG. 11, part of the infrared radiation emanating from MEMS module 204 is reflected onto detector module 205 via reflecting surface 218 constituting the Reference channel of the presently invented NDIR gas sensor. Another part of the infrared radiation emanating from MEMS module 204 enters perpendicularly through lens 212 located in detector can 202 into the custom sample chamber 209 constituting the Signal channel of the presently invented NDIR gas sensor fuse. The function of lens 212 is to render the radiation beam entering custom sample chamber 209 relatively or substantially collimated. The radiation 210 entering sample chamber 209 is bent 90° by reflecting surface 217 (which may also be a mirror) so that radiation is now propagating parallel to the top surface of the header. At this point the reflected radiation may be conveyed directly to reflecting surface 219 (which may also be another mirror) so that it will exit sample chamber 209 perpendicularly via window 213 onto detector module 206. In this arrangement, the length of the Signal channel will depend upon the height of sample chamber 209. However, a more compact sample chamber could be formed by using multiple reflecting surfaces or mirrors (not shown) oriented at angles as is taught above in connection with the case of custom dish sample chamber 103 (see also FIG. 9). Thus, one achieve a desired path length needed for a given NDIR sensor application by adjusting the height of sample chamber 209 and/or the number of reflections made by signal beam 210 within sample chamber 209.

The formation of the Reference and Signal channels by the optoelectronic and opto-mechanical components follows the teaching of the Absorption Biased methodology for NDIR gas sensors as disclosed in U.S. application Ser. No. 12/759,603 by the present inventor.

Because the space between detector can 202 and detector header 201 is sealed off from ambience by welding joint 215, lens 212 and window 213 and is filled with 100% Nitrogen, the Reference channel does not feel any effect from ambient gas of interest to be detected (e.g. $CO_2$ or methane) present in the custom sample chamber 209 which is in communication with the outside ambient atmosphere through openings 216. On the other hand, infrared radiation emanated by MEMS module 204 for the Signal channel enters custom sample chamber 209. Therefore the Signal channel will be sensitive to the presence of any gas of interest to be detected in the surrounding ambience which is in communication with sample chamber 209 via openings 216 and filters 207.

The roles played by the optoelectronic components for performing the signal processing function are the same as for U.S. Pat. No. 8,003,945.

As shown in FIG. 11, infrared radiation from MEMS module 204 is directed via the reflecting surfaces of the detector can housing 202 to detector modules 205 and 206 constituting, respectively, the Reference and Signal channels of the NDIR gas sensor.

The components of the electronics module used in the present invention, which are preferably mounted on PCB 203, can include the same components described in U.S. Pat. No. 8,003,945. Thus, the electronics module can include temperature sensor, a heater or means for supplying heat to regulate the temperature of the header housing and a voltage regulator.

This improved and intrinsically safe NDIR gas sensor can be used to detect carbon dioxide, methane or any other suitable gas, and it can be used to create a sensitive NDIR gas sensor or what I have called an NDIR gas sensor fuse.

While the invention has been described herein with reference to preferred embodiments, these embodiments have been presented by way of example only, and not to limit the scope of the invention. Additional embodiments thereof will be obvious to those skilled in the art having the benefit of this detailed description. Further modifications are also possible in alternative embodiments without departing from the inventive concept.

Accordingly, it will be apparent to those skilled in the art that still further changes and modifications in the actual concepts described herein can readily be made without departing from the spirit and scope of the disclosed inventions.

What is claimed is:

1. A Non-Dispersive Infrared ("NDIR") gas sensor for detecting the presence of a chosen gas, comprising:
   a mechanical housing comprising:
   a can having at least one inner reflective surface, a first window and a second window formed in the can;
   a header housing affixed to the can;
   a sample chamber affixed to the can; and
   an electronics module contained within the can, said electronics module comprising:
   an infrared source that emits radiation when power is applied to it;
   a reference detector that produces a reference output;
   a signal detector that produces a signal output; and
   a microprocessor that receives the reference output and the signal output;
   wherein each of the reference detector and the signal detector have an identical narrow band pass filter with the same Center Wavelength ("CWL"), Full Width Half Maximum (FWHM) and transmittance efficiency at the CWL; and
   wherein the reference detector and the signal detector are mounted in the electronics module so that the at least one inner reflective surface and the sample chamber create a signal channel path length detected by the signal detector that is greater than a reference channel path length detected by the reference detector.

2. The NDIR gas sensor of claim 1, wherein the first window is comprised of a lens that renders radiation entering the sample chamber substantially collimated.

3. The NDIR gas sensor of claim 1, wherein the header housing is comprised of a metal.

4. The NDIR gas sensor of claim 1, wherein the header is sealed to the can so as to create a hermetically sealed environment containing the electronics module.

5. The NDIR gas sensor of claim 1, wherein each of the reference detector and the signal detector are further comprised of a thermopile detector with the identical narrow band pass filter mounted on its top and communicable with an Application Specific Integrated Circuit ("ASIC") such that infrared radiation received by the thermopile detector after passing through the identical narrow band pass filter is converted into a digital signal ready to be transmitted to the microprocessor.

6. The NOIR gas sensor of claim 5, wherein the signal channel path length is sufficiently greater than the reference channel path length so that the electronics can use an absorption bias between the signal output and the reference output to determine the chosen gas concentration in the sample chamber.

7. The NDIR gas sensor of claim 1, wherein the electronics module is mounted on a printed circuit board.

8. The NDIR gas sensor of claim 7, wherein the electronics module further comprises a temperature sensor.

9. The NDIR gas sensor of claim 8, further comprising means for supplying heat to regulate the temperature of the header housing.

10. The NDIR gas sensor of claim 9, wherein the electronics module further comprises a voltage regulator affixed to the top surface.

11. The NDIR gas sensor of claim 1, wherein the infrared source is comprised of a Microelectronic Mechanical System ("MEMS") source.

12. A Non-Dispersive Infrared ("NDIR") gas sensor for detecting the presence of a chosen gas, comprising:
    a mechanical housing comprising:
        a can having at least one inner reflective surface, a first window and a second window formed in the can;
        a header housing hermetically sealed to the can;
        a sample chamber affixed to the can; and
        an electronics module mounted on a printed circuit board contained within the can, said electronics module comprising:
            a Microelectronic Mechanical System ("MEMS") source;
            a reference detector that produces a reference output;
            a signal detector that produces a signal output; and
            a microprocessor that receives the reference output and the signal output;
    wherein each of the reference detector and the signal detector have an identical narrow band pass filter with the same Center Wavelength ("CWL"), Full Width Half Maximum (FWHM) and transmittance efficiency at the CWL; and
    wherein the reference detector and the signal detector are mounted in the electronics module so that the at least one inner reflective surface and the sample chamber create a signal channel path length detected by the signal detector that is greater than a reference channel path length detected by the reference detector.

13. The NDIR gas sensor of claim 12, wherein the signal channel path length is sufficiently greater than the reference channel path length so that the electronics can use an absorption bias between the signal output and the reference output to determine the chosen gas concentration in the sample chamber.

14. The NDIR gas sensor of claim 13, wherein the first window is comprised of a lens that renders radiation entering the sample chamber substantially collimated.

15. The NDIR gas sensor of claim 14, wherein the header housing is comprised of a metal.

16. The NDIR gas sensor of claim 15, wherein each of the reference detector and the signal detector are further comprised of a thermopile detector with the identical narrow band pass filter mounted on its top and communicable with an Application Specific Integrated Circuit ("ASIC") such that infrared radiation received by the thermopile detector after passing through the identical narrow band pass filter is converted into a digital signal ready to be transmitted to the microprocessor.

17. The NDIR gas sensor of claim 16, wherein the electronics module further comprises a temperature sensor.

18. The NDIR gas sensor of claim 17, further comprising means for supplying heat to regulate the temperature of the header housing.

19. The NDIR gas sensor of claim 18, wherein the electronics module further comprises a voltage regulator affixed to the top surface.

20. A Non-Dispersive Infrared ("NDIR") gas sensor for detecting the presence of a chosen gas, comprising:
    a mechanical housing comprising a can and a header housing hermetically seated to the can;
    an electronics module mounted within the mechanical housing, said electronics module comprising:
        an infrared source;
        a reference detector that produces a reference output;
        a signal detector that produces a signal output; and
        a microprocessor that receives the reference output and the signal output;
    a sample chamber attached to the mechanical housing; and
    a first and a second window formed in the mechanical housing to allow radiation from the infrared source to enter into and return from the sample chamber;
    wherein each of the reference detector and the signal detector have an identical narrow band pass filter with the same Center Wavelength ("CWL"), Full Width Half Maximum (FWHM) and transmittance efficiency at the CWL; and
    wherein the reference detector and the signal detector are mounted in the electronics module so that the sample chamber creates a signal channel path length detected by the signal detector that is greater than a reference channel path length detected by the reference detector.

* * * * *